United States Patent
Buchner et al.

(10) Patent No.: US 12,289,837 B2
(45) Date of Patent: Apr. 29, 2025

(54) METHOD OF PRODUCING PRINTED CIRCUIT BOARDS

(71) Applicant: Gebr. Schmid GmbH, Freudenstadt (DE)

(72) Inventors: Christian Buchner, Baiersbronn (DE); Jürgen Haungs, Freudenstadt (DE); Christian Schmid, Freudenstadt (DE)

(73) Assignee: Gebr. Schmid GmbH, Freudenstadt (DE)

( * ) Notice: Subject to any disclaimer, the term of this patent is extended or adjusted under 35 U.S.C. 154(b) by 37 days.

(21) Appl. No.: 18/019,104

(22) PCT Filed: Jul. 15, 2021

(86) PCT No.: PCT/EP2021/069901
§ 371 (c)(1),
(2) Date: Feb. 1, 2023

(87) PCT Pub. No.: WO2022/028852
PCT Pub. Date: Feb. 10, 2022

(65) Prior Publication Data
US 2023/0284391 A1    Sep. 7, 2023

(30) Foreign Application Priority Data
Aug. 3, 2020 (DE) .......................... 102020209767.4

(51) Int. Cl.
*H05K 3/06* (2006.01)

(52) U.S. Cl.
CPC ....... *H05K 3/062* (2013.01); *H05K 2203/107* (2013.01)

(58) Field of Classification Search
None
See application file for complete search history.

(56) References Cited

U.S. PATENT DOCUMENTS 11,121,301 B1 * 9/2021 Marshall ................. H01L 24/81
2012/0291275 A1   11/2012 Rha et al.
(Continued)

FOREIGN PATENT DOCUMENTS

| EP | 0 611 121 A2 | | 8/1994 |
|----|-------------|---|--------|
| JP | H07-240568 A | * | 9/1995 |
| TW | 201702766 A | | 1/2017 |

OTHER PUBLICATIONS

Wikipedia, "Sp[in coating" via https://en.wikipedia.org/wiki/Spin_coating ; pp. 1-3 (Year: 2024).*

(Continued)

*Primary Examiner* — Binh X Tran
(74) *Attorney, Agent, or Firm* — DLA Piper LLP (US)

(57) ABSTRACT

A method of producing a printed circuit board includes providing a base substrate that is a film or plate, has first and second substrate sides and consists partly of an electrically non-conducting organic polymer material, where the first substrate side is covered with a capping metal layer, and regionally removing the capping metal layer, wherein regionally removing the capping metal layer includes applying a mask layer to the capping metal layer, regionally removing the mask layer by a laser so that the first substrate side is divided into at least one first subregion, in which the first substrate side is covered only with the capping metal layer, and into at least one second subregion, in which the first substrate side is covered with the capping metal layer and by the mask layer, and removing the capping metal layer in the at least one first subregion by an etching solution.

13 Claims, 3 Drawing Sheets

(56) References Cited

U.S. PATENT DOCUMENTS

2019/0014667 A1* 1/2019 Bahl ...................... H05K 3/429
2021/0033975 A1* 2/2021 Sejoubsari ................ G03F 7/34
2022/0276558 A1* 9/2022 Abe ........................ G03F 7/027

OTHER PUBLICATIONS

International Search Report dated Nov. 3, 2021 in counterpart International Application No. PCT/EP2021/069901 w/translation.
Written Opinion dated Nov. 3, 2021 in counterpart International Application No. PCT/EP2021/069901.
Search Report dated Jan. 10, 2025, from counterpart Taiwanese Patent Application No. 110127656.

* cited by examiner

METHOD OF PRODUCING PRINTED CIRCUIT BOARDS

TECHNICAL FIELD

This disclosure relates to a method of producing printed circuit boards and also printed circuit boards produced by the method.

BACKGROUND

A printed circuit board (PCB for short) serves as a carrier for electronic components and ensures their electrical contacting. Almost every electronic device contains one or more printed circuit boards.

Printed circuit boards always comprise a base substrate, which is electrically non-conducting in form and which on at least one substrate side has a structure composed of conductor tracks (conductor structure for short) for electrical contacting of the electronic components. In general, base substrates for printed circuit boards consist of fiber-reinforced plastic of polymeric films or laminated paper. The conductor tracks usually consist of a metal such as copper.

In its simplest form, only one side of the base substrate has a conductor structure. However, more complex circuits frequently require more than one conductor track plane, whenever a multilayer printed circuit board (or multilayer board, MLB for short) is required. In these examples, both sides of a carrier layer may have been provided with a conductor structure, or else a plurality of base substrates each with one conductor track plane are combined to form an MLB. In particular, base substrates provided on both sides with a conductor structure may also form a basis for multilayer constructions. The conductor tracks of the various conductor track planes may be connected electrically to one another by way of vias. For this purpose it is possible, for example, to drill holes into the base substrates and to metallize the walls of the drilled holes.

The conductor structures are usually formed on a base substrate subtractively in a multi-stage photolithographic process using a photoresist (resist for short), whose solubility in a developer solution can be influenced by radiation, more particularly by UV radiation. In one usual procedure, a metal layer, usually a copper layer, is formed on the base substrate and covered with a layer of the photoresist. The layer of the photoresist may be laminated onto the metal layer, for example. Subsequently the layer of the photoresist is exposed to the aforementioned radiation in an exposure step, with subregions of the layer being protected from exposure to radiation by an exposure mask. Depending on the photoresist used and on the developer solution used, either the exposed or the unexposed subregions of the layer on the photoresist are soluble in the developer solution and can be removed in a downstream step (resist stripping). In this downstream step, the developer step, subregions of the metal layer are uncovered on the base substrate, and can be removed wet-chemically in a further downstream step, an etching step. The remnants of the metal layer that remain after the subsequent complete removal of the resist form the desired conductor structure. This structure may optionally be reinforced in a deposition step, by electrodeposition of a suitable metal, for example.

Production therefore dictates that the conductor tracks are located on the surface of a base substrate. In production of MLBs, this may be disadvantageous. If a surface of a base substrate provided with conductor tracks is pressed against a further base substrate, there is subsequently often a requirement for monitoring and correction owing to deviations caused by temperatures and pressures that occur during pressing. Conductor tracks on the surface of base substrates are subject to such stresses to a particular degree. The smaller the distances and dimensions of the conductor tracks on the substrate, the greater, generally speaking, the corresponding need for monitoring and correction, in respect, for example, of existing impedance and signal speed requirements.

For environmental reasons, there are problems with the subtractive etching of the metal layer formed on the base substrate, as described. Commercial photoresists are not recyclable. The waste solutions arising contain fractions of organic compounds and, consequently, they are complicated and expensive to dispose of in an environmentally compatible way. In many processes, furthermore, it is necessary for the resist formed after subtractive etching to be removed in a separate process step.

SUMMARY

We provide a method of producing a printed circuit board having a metallic conductor structure including: a. providing a base substrate including a film or plate, having a first substrate side and a second substrate side and consisting partly of an electrically non-conducting organic polymer material, wherein the first substrate side is covered with a capping metal layer, and b. regionally removing the capping metal layer, wherein regionally removing the capping metal layer is accomplished by c. applying a mask layer to the capping metal layer, d. regionally removing the mask layer by a laser so that the first substrate side is divided into at least one first subregion, in which the first substrate side is covered only with the capping metal layer, and into at least one second subregion, in which the first substrate side is covered with the capping metal layer and by the mask layer, and e. removing the capping metal layer in the at least one first subregion by an etching solution, wherein f the mask layer is formed of titanium, zinc, titanium dioxide, titanium nitride, zinc oxide and/or a polymer material.

BRIEF DESCRIPTION OF THE DRAWINGS

Further features, details and preferences are apparent from the appended claims and the abstract, the wording of both of which is incorporated by reference in the content of the description, and from the description hereinafter of preferred examples of the method, and also with reference to the drawings.

DETAILED DESCRIPTION

Figure 1A:
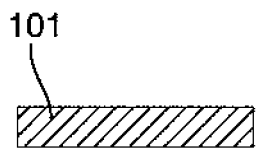
FIGS. 1A-1U schematically illustrate the course of our method in accordance with the particularly preferred second example described above.
Figure 1B:
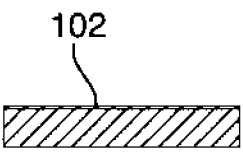
Figure 1C:
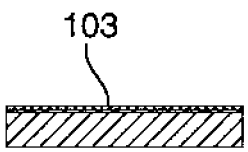
Figure 1D:
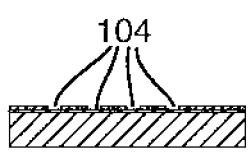
Figure 1E:
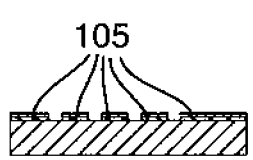
Figure 1F:
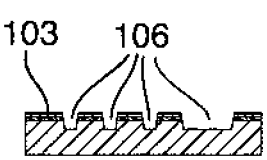
Figure 1G:
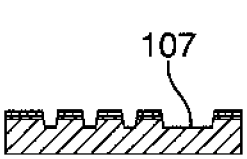
Figure 1H:
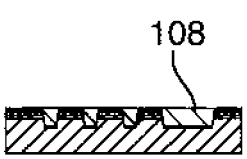
Figure 1I:
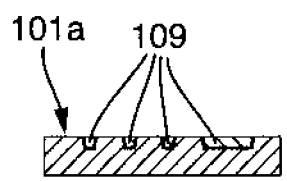
Figure 1J:
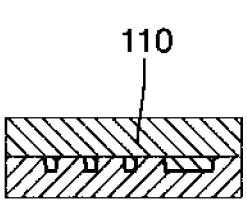
Figure 1K:
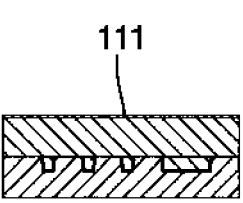
Figure 1L:
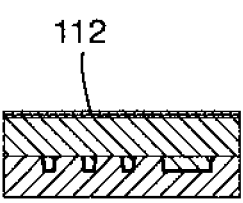
Figure 1M:
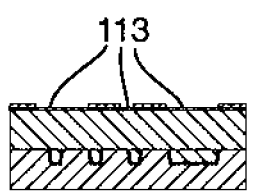
Figure 1N:
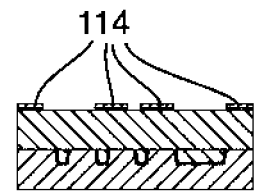
Figure 1O:
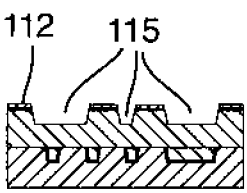
Figure 1P:
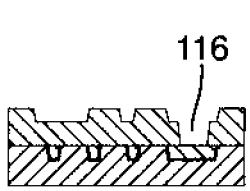
Figure 1Q:
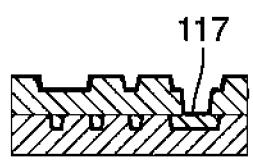
Figure 1R:
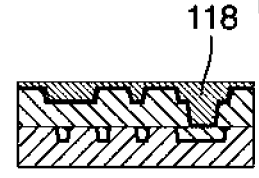
Figure 1S:
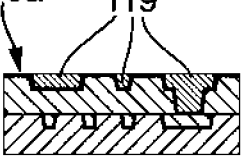
Figure 1T:
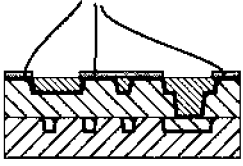

Our method of producing a printed circuit board having a metallic conductor structure always comprises a. to e.:

a. providing a base substrate comprising a film or plate, has a first substrate side and a second substrate side and consists at least partly of an electrically non-conducting organic polymer material, where the first substrate side is covered with a capping metal layer, and b. regionally removing the capping metal layer, wherein regionally removing the capping metal layer is accomplished by c. applying a mask layer to the capping metal layer, d. regionally removing the mask layer by a laser so that the first substrate side is divided into at least one first subregion, in which the first substrate side is covered only with the capping metal layer, and into at least one second subregion, in which the first substrate side is covered with the capping metal layer and by the mask layer, and e. removing the capping metal layer in the at least one first subregion by an etching solution.

The method is distinguished particularly by f.:

f. the mask layer is formed of a metal and/or a metal compound and/or a polymer material that is more resistant chemically to the etching solution than the metal of the capping metal layer.

Our method permits substitution of the conventional photoresist process in PCB production. In place of the photoresists conventionally used, the mask layer is formed using the metal and/or the metal compound and/or the polymer material, which have the advantage that they can be structured by a laser ablation technique. The metal or metal compound ablated within step d. above, for example, can be drawn off under suction, collected and reutilized, to form further mask layers, for example. The method therefore enables environmentally compatible fabrication of printed circuit boards in a circulatory system.

Preferably, the method additionally comprises at least one of a. to c.:

a. The capping metal layer is formed of copper.

b. The etching solution is a solution for etching copper.

c. The metal and/or the metal compound and/or the polymer material of which the mask layer is formed is chemically more resistant to the etching solution than is copper.

More preferably the directly preceding a. to c. are realized in combination with one another.

The copper in question need not necessarily be ultra-pure copper. In preferably small amounts, the capping metal layer optionally further comprises fractions of one or more other metals. The capping metal layer may therefore also consist of a copper alloy.

Suitable alternatives to the copper or copper alloy as capping metal include, in principle, nickel-chromium alloys. In this example, the etching solution is a solution for etching the nickel-chromium alloy. The metal and/or the metal compound and/or the polymer material of which the mask layer is formed must in this example be more resistant chemically to the etching solution than to the nickel-chromium alloy.

Very generally, chemical resistance means that the proclivity of a metal or an alloy in contact with an etching solution to pass into solution is low. A metal is therefore more resistant chemically than another if in contact with an etching solution it dissolves more slowly under identical conditions (in particular, same etching solution, same temperature).

Irrespective of the material of which it is composed, the capping layer ought to be uninterrupted. It preferably has a thickness of 10 nm to 10 μm, more preferably 20 nm to 6 μm.

The etching solution is more preferably an etching solution based on copper chloride or ammonium persulfate. This is so especially when the capping metal layer is formed of copper or a copper alloy.

To form the capping metal layer, it is possible to apply, more particularly by lamination, a thin metal foil, more particularly a thin copper foil, to the first substrate side as a capping metal layer. With preference, however, the method comprises at least one of a. to c.:

a. To provide the base substrate, the capping metal layer is formed by physical vapor deposition (PVD) or chemical vapor deposition (CVD) on the first substrate side.

b. The capping metal layer is formed by sputtering on the first substrate side.

c. The capping metal layer is formed by a wet-chemical coating process.

Metallizations by physical and chemical vapor depositions and also the generation of metal layers by wet-chemical coating processes or sputter deposition are state of the art and require no further elucidation.

With particular preference, a copper layer is applied as capping metal layer to the base substrate by sputtering.

It may be preferable for an adhesion-promoting adhesion layer to be applied to the first substrate side before the formation of the capping metal layer or during the application of the capping metal layer.

Preferably, the method additionally comprises a.:

a. The metal and/or the metal compound of which the mask layer is formed absorbs the radiation of the laser more strongly than does the metal of the capping metal layer.

The laser used to remove the mask layer is preferably a laser with a wavelength of 266 nm to 12 μm. In agreement with this, it is particularly preferable for the mask layer to be notable in that its light absorption at a given wavelength of the laser within this range is higher than that of the underlying capping metal layer. This can be brought about in particular through the choice of a suitable metal or suitable metal compound.

Polymer materials on metal layers can be readily removed by laser exposure, as they have a comparatively low heat resistance.

The laser may be used in pulsed or continuous form.

Preferably, the method additionally comprises one of a. or b.:

a. The mask layer is formed of titanium or of zinc.

b. The mask layer is formed of a metal oxide, a metal nitride or a metal carbide, more particularly of titanium dioxide, titanium nitride or zinc oxide.

Titanium and zinc in particular have proven to be especially suitable, in relation not only to the aspect of chemical resistance but also in relation to the aspect of light absorption, particularly in relation to a capping metal layer of copper or of a copper alloy. Titanium and zinc, for example, can be applied to substrates by sputtering or CVD, with recycling being a further possibility.

Certain compounds of titanium and of zinc have similarly positive properties. Deserving of emphasis in particular are the titanium dioxide, titanium nitride and zinc oxide materials already stated above. These materials as well have proven to be especially suitable, particularly when using a mask layer of copper.

Preferably, the titanium and zinc may comprise extraneous substances, examples being doping elements. Commonly, however, they have a purity >95%, preferably >98%.

It may be preferable to form the mask layer from the abovementioned polymer material, more particularly from a non-photosensitive polymer. Particularly suitable in this context are mask layers of polyamide or of epoxy resin. In principle, however, all polymer materials which can be removed from a metallic surface by a laser are suitable.

Preferably, the method additionally comprises at least one of the directly following additional features a. to e.:
a. The mask layer is formed in a thickness which is less than the thickness of the capping metal layer.
b. The mask layer has a thickness of 5 nm to 10 µm or 10 nm to 10 µm.
c. The mask layer is formed by physical or chemical vapor deposition.
d. The mask layer is formed by sputtering.
e. The mask layer is formed by a wet-chemical coating process.

More preferably a. and b. directly above are realized jointly and also in combination with one of c., d. or e.

More preferably, the mask layer is formed in a thickness of 5 nm to 1000 nm, more preferably of 5 nm to 500 nm, especially particularly of 5 nm to 250 nm. This applies especially to examples in which the mask layer is formed of titanium, zinc, titanium dioxide, titanium nitride and zinc oxide. When a polymer material is used, the layer may also have a thickness in the µm range, for example, of 2 to 10 µm.

Particularly preferably, the method is additionally distinguished by a.:
a. The mask layer is removed after the removal of the capping metal layer in the at least one second subregion, with the capping metal layer remaining in the second subregion as conductor structure or as part of a conductor structure.

The regional removal of the capping metal layer, employing a masking step, is concluded therewith. The capping metal layer remaining in the second subregion forms the metallic conductor structure or a part of the metallic conductor structure. Production of the printed circuit board may subsequently continue in a conventional way. For example, the conductor structure may be protected by coating with a solder resist. Free contacts may be coated with a noble metal, for example, with gold, silver or platinum. In principle it is also possible to apply an insulation layer to the conductor structure to construct an MLB, with a further conductor structure being introduced into or applied to the free side of the insulation layer, the further conductor structure being connected optionally by way of vias to the conductor structure formed previously.

Alternatively, a particularly preferred second example of the method is additionally distinguished by at least one of a. to d.:
a. After removal of the capping metal layer in the at least one first subregion, the first substrate side is exposed to a plasma, with the aid of which the polymer material in the at least one first subregion is ablated to form at least one depression.
b. The at least one depression is filled with a filling metal.
c. Complete removal of the capping metal layer and of the mask layer in the at least one second subregion.
d. Optional planarization of the first substrate side with the filled-in at least one depression.

More preferably a. and b. and c. directly above are realized in combination with one another. d. is an optional step, which may follow. In some examples, however, complete removal of the capping metal layer and of the mask layer may also take place during a planarization according to d. c. and d. may therefore be identical in certain examples.

Preferably, c. is carried out before b., that is, after exposure of the first substrate side to the plasma, the capping metal layer and the mask layer are completely removed in the at least one second subregion. The result is a first substrate side with depressions, which is free of the capping metal layer and of the mask layer. In that example the depressions are filled with the filling material in a downstream step, ideally followed by the planarization according to d.

According to this second example of the method, the conductor structure or a part of a conductor structure is formed in the at least one depression and not in the second subregion. The result is a conductor structure which is sunk in the base substrate.

Particularly preferably, the mask layer is not removed as part of a separate removal step. Instead it is preferred for the mask layer to be removed during the plasma treatment according to a. of the particularly preferred second example of the method. Surprisingly it has emerged, we found that this is possible efficiently if the mask layer is formed from one of the above-stated materials (titanium, zinc, titanium dioxide, titanium nitride, zinc oxide or the polymer material), and more particularly when the mask layer is formed in the aforementioned thickness of 5 nm to 1000 nm, more preferably 5 nm to 500 nm, especially preferably 5 nm to 250 nm. This thickness is generally sufficient to protect the capping metal layer during the use of the etching solution on the at least one first subregion, in all the other regions. It is, however, not thick enough to withstand the plasma treatment, not even in the metals titanium and zinc. In a mask layer made of polymer material, the mask layer may also amount to multiple µm. With a sufficiently long treatment time, therefore, the mask layer can be removed by the plasma without residue. It is thus possible to shorten the method by one complete step, allowing the efficiency of the method to be increased significantly.

Irrespective of the way in which the mask layer is removed, a feature common to the stated materials (titanium, zinc, titanium dioxide, titanium nitride, zinc oxide or the polymer material) is that in the ongoing method they are environmentally and physiologically unobjectionable. After they have been removed, the titanium, the zinc, the titanium dioxide, the titanium nitride and the zinc oxide can be recycled. The mask layer may optionally be removed simultaneously with the capping metal layer, as part of an etching process described below, for example. In the course of removal, the polymer material is decomposed by the plasma and converted into a state in which it can be disposed of by way of the wastewater. This is in particular if the polymer material comprises the polyamide or epoxy resin.

In a development of the particularly preferred first and second examples of the method, the method is employed to construct a multilayer printed circuit board. In this multilayer circuit board, the conductor structure sunk in the base substrate and obtained according to the second example, or the capping metal layer remaining in the second subregion in accordance with the first example of the method and functioning as conductor structure, forms a first conductor structure, which may optionally be connected to further conductor structures in the printed circuit board.

The method may additionally comprise at least one of a. to f.:
a. Covering the first conductor structure with an insulation layer, which in composite assembly with the base substrate has a bottom side directly in contact with the first conductor structure, and a top side facing away from the first conductor structure, and which consists at least partly of an electrically non-conducting organic polymer material.
b. If not yet present, formation of a capping metal layer on the top side of the insulation layer, c. Regional removal of the capping metal layer to divide the top side into at least one first subregion, in which the top side is free of the capping metal layer, and into at least one second subregion, in which the top side is covered with the capping metal layer, d. Causing a plasma to act on the top side, with the aid of which the polymer material in the at least one first subregion is ablated to form at least one depression, e. Filling of the at least one depression with a filling metal, and f. Complete removal of the capping metal layer in the at least one second subregion to form a second conductor structure or a part of a second conductor structure.

With preference, at least a. to c. directly above are realized in combination with one another. The three steps according to d. to f. follow in combination in preferred examples.

It is, though, also possible for the capping metal layer remaining in the second subregion of the top side already to form a second metallic conductor structure or a part of the metallic conductor structure, in analogy to the above-described particularly preferred first example of the method. In this example, there is no need for d. to f directly above.

The regional removal of the capping metal layer in c. directly before, with division of the top side of the insulation layer, may of course in preferred examples take place in the same way as in the regional removal of the capping metal layer on the first substrate side of the base substrate.

The insulation layer is preferably like the base substrate provided in a. With preference, therefore, it is a film or plate and consists at least partly of an electrically non-conducting organic polymer material. Particularly preferably, the insulation layer and the base substrate are identical in their example.

Through multiple repetition of a. to c. directly above, and especially of a. to f directly above, it is possible to carry out sequential construction of MLBs having in principle as many layers as desired.

Preferably, the method comprises at least one of a. to c.:
a. The base substrate and/or the insulation layer has a thickness of 10 µm to 3 mm, preferably 10 µm to 2 mm.
b. The organic polymer material of the base substrate and/or of the insulation layer is a thermoplastic polymer material, preferably selected from the group containing polyimide, polyamide, Teflon, polyester, polyphenylene sulfide, polyoxymethylene and polyetherketone.

With preference a. and b. directly above are realized in combination with one another.

More preferably, the base substrate and the insulation layer each comprise a film of a polymer material, more particularly one of the stated polymer materials. This is especially when the printed circuit board to be produced is multilayer in its configuration. In a one-layer printed circuit board, a comparatively thicker base substrate comprising a plate is selected in certain preferred examples.

More preferably, the method, more particularly the particularly preferred second example of the method, is distinguished by at least one of a. to c.:
a. The base substrate and/or the insulation layer comprise fillers, more particularly dielectric fillers.
b. The base substrate and/or the insulation layer is a polymeric film with the fillers.
c. The fillers have an average particle size (d50)<1 µm.

With preference a. and b. directly above and, also, in particular, a. to c., are realized in combination with one another.

The base substrate and/or the insulation layer may optionally comprise fillers, more particularly dielectric fillers. For example, the base substrate and/or the insulation layer may each be a film of one of the stated polymer materials, with silicon dioxide particles embedded therein.

Suitable dielectric fillers include, in particular, metal oxides or semi-metal oxides (in addition to silicon dioxide, in particular, aluminium oxide, zirconium oxide or titanium oxide) and other ceramic fillers (particularly silicon carbide or boron nitride or boron carbide). Silicon as well may optionally be employed.

The fillers are preferably in particulate form, more particularly have an average particle size (d50) in the nanometer range (<1 µm).

To facilitate handling, the base substrate may be applied, for processing, to a carrier or an auxiliary substrate, made from glass or aluminium, for example.

Preferably, particularly of the particularly preferred second example of the method, the method comprises at least one of a. and b.:
a. The plasma is provided using a process gas from the group containing $O_2$, $H_2$, $N_2$, argon, helium, $CF_4$, $C_3F_8$, $CHF_3$ and mixtures of the aforesaid gases such as $O_2/CF_4$.
b. The plasma is caused to act at a temperature of 15° C. to 200, preferably minus 15° C. to 80° C.

With preference a. and b. directly above are realized in combination with one another.

More preferably, the process gas used for providing plasma comprises at least one of the reactive gases from the group containing $CF_4$, $C_3F_8$ and $CHF_3$.

Etching by plasma is also state of the art. In plasma etching, process gases are used which are able to transport the material for etching into the gas phase. The gas enriched with the material removed by etching is pumped off, and fresh process gas is fed in. Accordingly removal is continuous.

Particularly preferably, an inductively coupled plasma (ICP plasma), generated, for example, by an ICP generator with DC Bias is used.

Particularly well suited to etching the preferred polymer materials designated above are the process gases stated directly above.

It is important that in the at least one first subregion of the first substrate side and/or in the at least one first subregion of the top side, the base substrate consisting of the polymer material and/or the insulation layer can come directly into contact with the plasma, while the at least one second subregion of the first substrate side and/or the at least one second subregion of the top side is covered with the respective capping metal layer. Generally speaking, metals are etched more slowly than polymer materials by a plasma, especially when using the stated process gases. Consequently, when the plasma is caused to act, depressions are formed exclusively in the area of the at least one first subregion of the first substrate side, while the capping metal layer and the mask layer (the latter at least temporarily) form a barrier which shields the respective at least one second subregion from the plasma. In this way the surface of the base substrate and also the surface of the insulation layer can be structured with depressions in a targeted manner and with high precision.

Particularly preferably, the plasma is used as part of an anisotropic etching process. In this example, ideally, ions of the plasma are accelerated perpendicularly to the surface of the substrate to be etched. The accelerated ions provide for physical sputtering ablation.

With particular suitability, the anisotropic etching process comprises examples of reactive ion etching (RIE) and of reactive ion beam etching (RIBE).

Accordingly, preferably, the method, more particularly the particularly preferred second example of the method, is distinguished by at least one of a. to c.:
   a. The plasma is used as part of an anisotropic etching process.
   b. In the anisotropic etching process, ions of the plasma are accelerated perpendicularly to the first substrate side and/or to the top side.
   c. The process gas used for providing the plasma comprises at least one of the reactive gases from the group containing $CF_4$, $C_3F_8$ and $CHF_3$.

With preference a. and b. directly above, more particularly a. to c. directly above, are realized in combination with one another.

Surprisingly, we found that the presence of the above-mentioned particulate fillers is advantageous for the outcome of the plasma ablation of material.

Preferably, the method comprises one of a. to c.:
   a. For filling the at least one depression in the first substrate side of the base substrate and/or in the top side of the insulation layer, the at least one depression is metallized in one step and the metallized at least one depression is filled with the filling metal in a downstream step.
   b. The metallization of the at least one depression takes place by physical or chemical vapor deposition, more particularly by sputtering of the first substrate side, or by a wet-chemical method.
   c. The first substrate side and/or the top side is metallized over the whole area.

With preference a. and b., more particularly a. to c., directly above are realized in combination with one another.

Preferably, as part of the metallization, a thin layer of copper or a copper alloy is formed.

In a wet-chemical metallization, the metallization is accomplished, for example, by deposition of copper from a solution.

Filling with the filling metal takes place preferably by electrochemical deposition. More preferably the filling is accomplished by a via fill method that enables the deposition to take place primarily in the at least one depression and also, optionally, in drilled holes or blind holes, with simultaneous minimization of unwanted deposition on the first substrate side and/or the top side, with reinforcement of the capping metal layer and also, optionally, the mask layer in the at least one second subregion.

A metallization layer applied to the whole area enables electrical contacting of the first substrate side and/or of the top side, for example, to be able to position a cathodic contact there for a subsequent electrochemical deposition, and to ensure that the entire substrate side can be coated.

Suitable filling metals include in principle all metals and alloys from which it is possible to produce conductor track structures on printed circuit boards. With particular preference, however,
   a. the filling metal with which the at least one depression is filled is copper or a copper alloy.

Preferably, in the particularly preferred second example of the method, the method comprises one of a. or b.:
   a. The removal of the capping metal layer and/or of the mask layer in the at least one second subregion of the substrate side and/or of the top side takes place by an etching step.
   b. The removal of the capping metal layer and/or of the mask layer in the at least one second subregion takes place by mechanical working of the first substrate side and/or of the top side.

The etching step is, for example, a conventional etching step using a strong acid such as hydrochloric acid.

Where the capping metal layer is removed mechanically, the capping metal layer can be removed, for example, by polishing and/or grinding. The aim is to remove the capping metal layer completely in the respective at least one second subregion. Only in this way is the formation of the conductor structure or of the part of the conductor structure concluded.

The complete removal of the capping metal layer in the at least one second subregion may preferably also comprise the removal of filling metal in the at least one first subregion and also, optionally, in the region of the at least one depression as well, at least in so far as the filling metal projects beyond the edge or the edges of the at least one depression.

With particular advantage, on mechanical working of the first substrate side, it is possible to remove not only the capping metal layer but also, at the same time, to effect planarization of the first substrate side. A preferred aim of the planarization is to level the first substrate side such that it has no conductor tracks projecting from the surface. Instead, the conductor structure is sunk preferably completely in the at least one depression.

Preferably, outer conductor structures formed in accordance with the method are protected by being coated with a solder resist. Free contacts may be coated with a noble metal, for example, with gold, silver or platinum.

In accordance with the method, printed circuit boards can be produced with extremely high resolution, in the µm range, at less expense and complexity and with lower production costs (and with a higher yield at the same time) than is conventional.

In the production of MLBs, more particularly with the sequential construction described, a positive feature is that the conductor structures are sunk in the base substrate. The pressures acting on the conductor structures when base substrates and insulation layers are pressed together are comparatively low, with positive consequences in relation to existing impedance and signal speed requirements. The fact that channels with extremely high precision can be formed by plasma etching also has a positive effect in this regard.

It is also possible to form such channels using a laser. By comparison, plasma etching affords the advantage that during the plasma etching, all channels and other depressions can be formed simultaneously and in one step, which is generally more cost-effective and quicker by a multiple. Furthermore, higher resolutions are achievable by plasma etching.

Figure 1U:
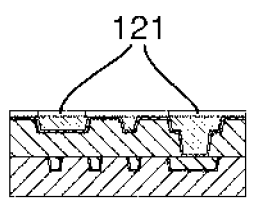
Figure 2A:
FIGS. 2A-2D schematically illustrate the course of another example of our method.
Figure 2B:
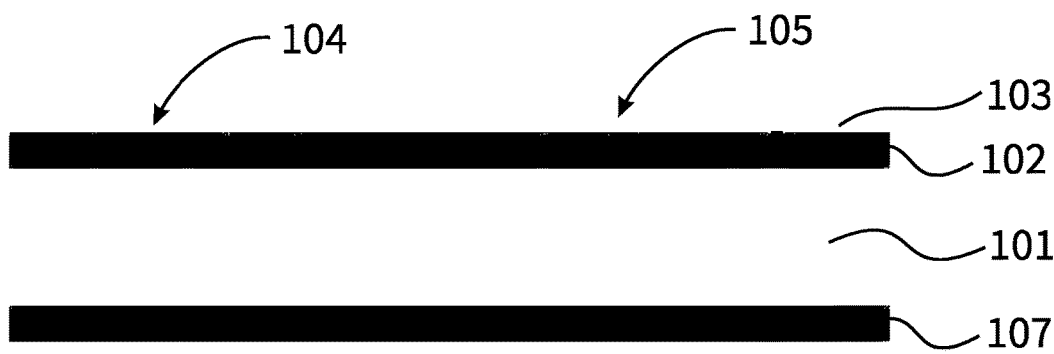
Figure 2C:
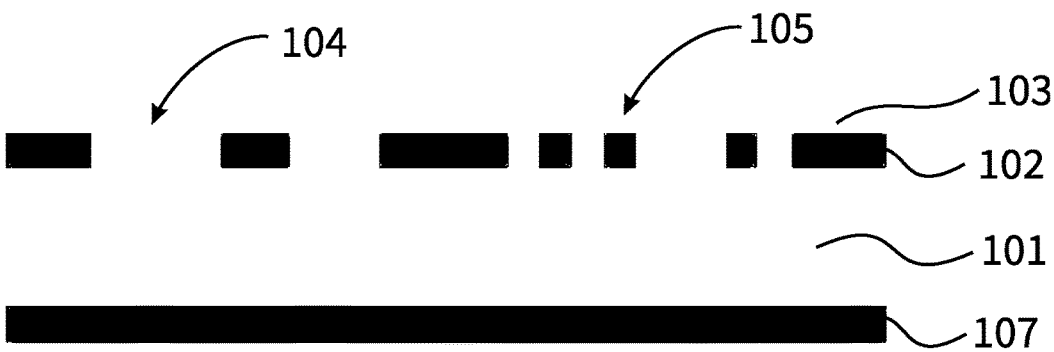
Figure 2D:
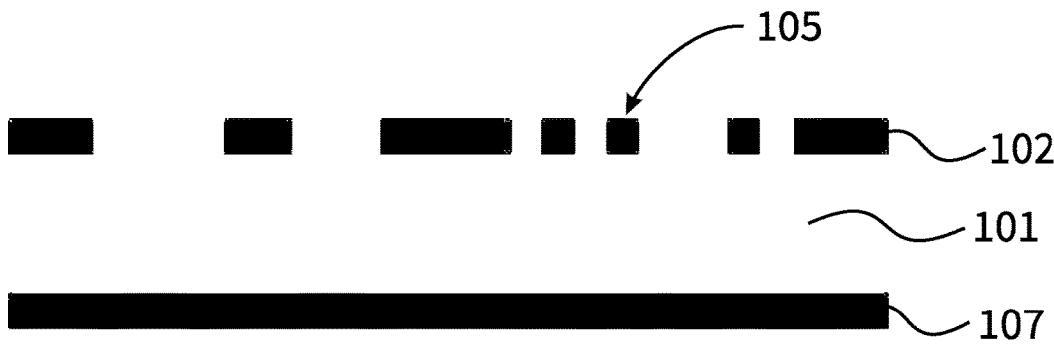
Figure 3A:
FIGS. 3A-3F schematically illustrate the course of another example of our method.
Figure 3B:
Figure 3C:
Figure 3D:
Figure 3E:
Figure 3F:

In a method according to FIGS. 1A-1U, in a step A, a base substrate 101 is provided. In step B this substrate is covered on its first substrate side 101a with a capping metal layer 102. For partial ablation of the capping metal layer 102, a mask layer 103 of titanium or of zinc is applied by sputtering in step C to the capping metal layer 102. The mask layer may alternatively also be formed of titanium dioxide, titanium nitride, zinc oxide or one of the above-stated polymer materials. In step D the mask layer 103 is removed in the first subregions 104 by laser ablation. In step E the capping metal layer 102 is removed in the first subregions 104, which are no longer covered by the mask layer 103, by an etching solution.

The substrate side 101a, originally covered completely with the capping metal layer 102, is now divided into the first subregions 104, in which it is free of the capping metal layer 102, and into the second subregions 105, in which it continues to be covered with the capping metal layer 102 and with the mask layer 103. In step F, a plasma is caused to act on the substrate side 101a. Whereas the subregions 105 are shielded from the plasma by the capping metal layer 102 and the mask layer 103, the effect of the plasma in the subregions 104 is to ablate material and, consequently, to form the depressions 106. If the action of the plasma is sufficient, however, the mask layer as well can be removed in this step. In step G the depressions 106 are metallized by sputtering, followed by the filling of the depressions 106 by electrochemical deposition of a filling metal 108 in step H. Excess filling metal 108 is then removed mechanically in step I, together with the capping metal layer 102 and the mask layer 103 (if such removal has not yet taken place) in the subregions 105. In this step, the conductor structure 109 is formed, being sunk in the depressions 106.

For formation of an MLB, an insulation layer 110 is laminated in step J directly onto the substrate side 101a having the conductor structure 109. In step K, the top side 110a of the insulation layer is covered with a capping metal layer 111, which is removed again regionally in steps L, M and N (in analogy to steps C, D and E) with application of a mask layer 112 of titanium (or titanium dioxide, titanium nitride, zinc oxide or one of the above-stated polymer materials) and regional removal thereof by laser ablation. The top side 110a of the insulation layer 110, originally fully covered with the capping metal layer 111, is now divided into the first subregions 113, in which it is free of the capping metal layer 111, and into the second subregions 114, in which it continues to be covered with the capping metal layer 111 and the mask layer 112. In step O, a plasma is caused to act on the top side 110a of the insulation layer 110.

Whereas the subregions 114 are shielded from the plasma by the capping metal layer 111 and the mask layer 112, the effect of this plasma in the subregions 113 is to ablate material and consequently to form the depressions 115. Here as well it is possible, if the action of the plasma is sufficient, for the mask layer to be removed at the same time. In step P the mask layer 112 and the capping metal layer 111 (in contrast to when working the base substrate 101) are removed by an etching solution. Furthermore, one of the depressions 115 formed is connected by a drill hole 116 to a depression 106 in the first conductor structure 109 that has already been filled with the filling metal 108. In step Q, the depressions 115, including the drilled hole 116, are metallized by sputtering, followed by the filling of the depressions 115 by electrochemical deposition of a filling metal 118 in step R. Excess filling metal 118 is then removed mechanically in step S, together with the capping metal layer 111 and the mask layer 112 in the subregions 114. In this step the conductor structure 119 is formed, sunk in the depressions 115. In step T a solder resist 120 is applied, followed by partial goldplating 121 of individual contacts of the conductor structure 119.

In a method according to FIGS. 2A-2D, a base substrate 101 is provided which is covered on its first substrate side 101a with the capping metal layer 102 made of copper, and on its second substrate side 101b with the capping metal layer 107, likewise made of copper. In a step A, a mask layer 103 of titanium is applied to the capping metal layer 102 by sputtering. In a step B, the mask layer 103 is ablated regionally by laser ablation, and so the first substrate side 101a is divided into at least one first subregion 104, in which the first substrate side 101a is covered only with the capping metal layer 102, and into at least one second subregion 105, in which the first substrate side 101a is covered with the capping metal layer 102 and by the mask layer. In a step C, the capping metal layer 102 is removed in the at least one region 104 with an etching solution. Lastly, in step D, the mask layer 103 is removed. The capping metal layer 102 remaining in the second subregion 105 forms a metallic conductor structure or part of a metallic conductor structure.

In a method according to FIGS. 3A-3F, the same base substrate 101 is provided as in the method according to FIGS. 2a-2d. In analogy to FIGS. 2A-2D, in step A, a mask layer 103 of titanium is applied by sputtering, and is regionally ablated by laser ablation in step B so that the first substrate side 101a comprises a first subregion 104, in which the first substrate side 101a is covered only with the capping metal layer 102. Then, in step C, the capping metal layer 102 is removed in the at least one region 104 with an etching solution. In step D, the substrate side 101a is exposed to a plasma, which in the at least one subregion 104 results in ablation of material and, consequently, in the formation of the depressions 106. Thereafter the capping metal layer 102 and the mask layer 103 are removed without residue, and optionally at this stage the mask layer as well may be ablated by the plasma. The depressions 106 are metallized in step E by sputtering (not depicted), followed by the filling of the depressions 106 by electrochemical deposition of a filling metal 108. In step F, the substrate side 101a is planarized. In this procedure, excess filling metal 108 is removed mechanically. The conductor structure 109 is formed, sunk in the depressions 106.

The invention claimed is:

1. A method of producing a printed circuit board having a metallic conductor structure comprising:
   a. providing a base substrate comprising a film or plate, having a first substrate side and a second substrate side and consists partly of an electrically non-conducting organic polymer material, wherein the first substrate side is covered with a capping metal layer, and
   b. regionally removing the capping metal layer,
   wherein regionally removing the capping metal layer is accomplished by
   c. applying a mask layer to the capping metal layer,
   d. regionally removing the mask layer by a laser so that the first substrate side is divided into at least one first subregion, in which the first substrate side is covered only with the capping metal layer, and into at least one second subregion, in which the first substrate side is covered with the capping metal layer and by the mask layer, and
   e. removing the capping metal layer in the at least one first subregion by an etching solution, wherein
   f. the mask layer is formed of titanium, zinc, titanium dioxide, titanium nitride, and/or zinc oxide.

2. The method according to claim 1, wherein at least one of:
   a. the capping metal layer is formed of copper,
   b. the etching solution is a solution for etching copper, and
   c. the titanium, zinc, titanium dioxide, titanium nitride, and/or zinc oxide of which the mask layer is formed is chemically more resistant to the etching solution than is copper.

3. The method according to claim 1, wherein the titanium, zinc, titanium dioxide, titanium nitride, and/or zinc oxide of which the mask layer is formed absorbs the radiation of the laser more strongly than does the metal of the capping metal layer.

4. The method according to claim 1, wherein one of:
   a. the mask layer is formed of titanium or of zinc, or b. the mask layer is formed of a zinc oxide or titanium dioxide, or titanium nitride.

5. The method according to claim 1, wherein at least one:
a. the mask layer is formed in a thickness less than a thickness of the capping metal layer,
b. the mask layer has a thickness of 5 nm to 10 µm,
c. the mask layer is formed by physical or chemical vapor deposition,
d. the mask layer is formed by sputtering, and
e. the mask layer is formed by a wet-chemical coating process.

6. The method according to claim 1, further comprising: filling the at least one depression with a filling metal.

7. The method according to claim 1, further comprising: completely removing the capping metal layer and the mask layer in the at least one second subregion to form the metallic conductor structure or a part of the metallic conductor structure.

8. The method according to claim 1, further comprising: planarization of the first substrate side with the filled-in at least one depression.

9. The method according to claim 1, wherein the mask layer is removed after removal of the capping metal layer in the at least one second subregion, with the capping metal layer remaining in the second subregion as conductor structure or as part of a conductor structure.

10. The method according to claim 9, further comprising:
a. covering a first conductor structure with an insulation layer, which in composite assembly with the base substrate has a bottom side directly in contact with the first conductor structure, and a top side facing away from the first conductor structure, and consists at least partly of an electrically non-conducting organic polymer material.

11. The method according to claim 9, further comprising: if not yet present, forming a capping metal layer on a top side of an insulation layer.

12. The method according to claim 9, further comprising: regionally removing the capping metal layer to divide a top side into at least one first subregion, in which the top side is free of the capping metal layer, and into at least one second subregion, in which the top side is covered with the capping metal layer.

13. The method according to claim 9, further comprising: completely removing the capping metal layer in the at least one second subregion to form a second conductor structure or a part of a second conductor structure.

* * * * *